United States Patent
Tweet et al.

(10) Patent No.: US 7,297,564 B1
(45) Date of Patent: Nov. 20, 2007

(54) FABRICATION OF VERTICAL SIDEWALLS ON (110) SILICON SUBSTRATES FOR USE IN SI/SIGE PHOTODETECTORS

(75) Inventors: Douglas J. Tweet, Camas, WA (US);
Jong-Jan Lee, Camas, WA (US);
Jer-Shen Maa, Vancouver, WA (US);
Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/416,985

(22) Filed: May 2, 2006

(51) Int. Cl.
*H01L 21/00* (2006.01)
(52) U.S. Cl. .......................................... 438/24; 438/22
(58) Field of Classification Search ............. 438/22–32
See application file for complete search history.

(56) References Cited

U.S. PATENT DOCUMENTS

| | | | |
|---|---|---|---|
| 5,994,724 | A | 11/1999 | Morikawa |
| 6,639,249 | B2 * | 10/2003 | Valliath ........................ 438/24 |
| 2005/0127275 | A1 | 6/2005 | Yang |
| 2005/0136637 | A1 | 6/2005 | Lee et al. |
| 2005/0153474 | A1 | 7/2005 | Tweet et al. |

OTHER PUBLICATIONS

Maiti et al., *Strained Silicon Heterostructures: Materials and Devices*, Chapter 10: Si/SiGe Optoelectronics, The Institution of Electrical Engineer, 2001.

Murtaza et al., *Room Temperature Electroabsorption in $Ge_xSi_{1-x}$ PIN Photodiode*, IEEE Trans. on Electron Devices, 2297-2300, vol. 41, No. 12, 1994.

Tashiro et al., *A Selective Epitaxial SiGe/Si Planar Photodetector for Si-Based OEICs*, IEEE Trans. on Electron Devices, 545-550, vol. 44, No. 4, 1997.

Vonsovici et al., *Room Temperature Photocurrent Spectroscopy of SiGe/Si p-i-n Photodiodes Grown by Selective Epitaxy*, IEEE Trans. on Electron Devices, 538-542, vol. 45, No. 2, 1998.

Jones et al., *Fabrication and Modeling of Gigahertz Photodetectors in Heteroepitaxial Ge-on-Si using Graded Buffer Layer Deposited by Low Energy Plasma Enhanced CVD*, IEDM, 2002.

Liu et al., *Multi-Fin Double-Gate MOSFET Fabricated by using (110)-Oriented SOI wafers and Orientation-Dependent Etching*, Electrochemical Society Proceedings, vol. 2003-06, 566 (2003).

Houghton, *Strain relaxation kinetics in $Si_{1-x}Ge_x/Si$ heterostructures*, J. Appl. Phys. vol. 780, No. 4, 1991.

* cited by examiner

*Primary Examiner*—Cuong Nguyen

(57) ABSTRACT

A method of fabricating vertical sidewalls on silicon (110) substrates for use in Si/SiGe photodetectors includes preparing a silicon (110) layer wherein the silicon (110) plane is parallel to an underlying silicon wafer surface. Masking the silicon (110) layer with mask sidewalls parallel to a silicon (111) layer plane and etching the silicon (110) layer to remove an un-masked portion thereof, leaving a patterned silicon (110) layer having vertical silicon (111) sidewalls. Removing the mask; growing SiGe-containing layers on the patterned silicon (110) layer; and fabricating a photodetector.

15 Claims, 4 Drawing Sheets

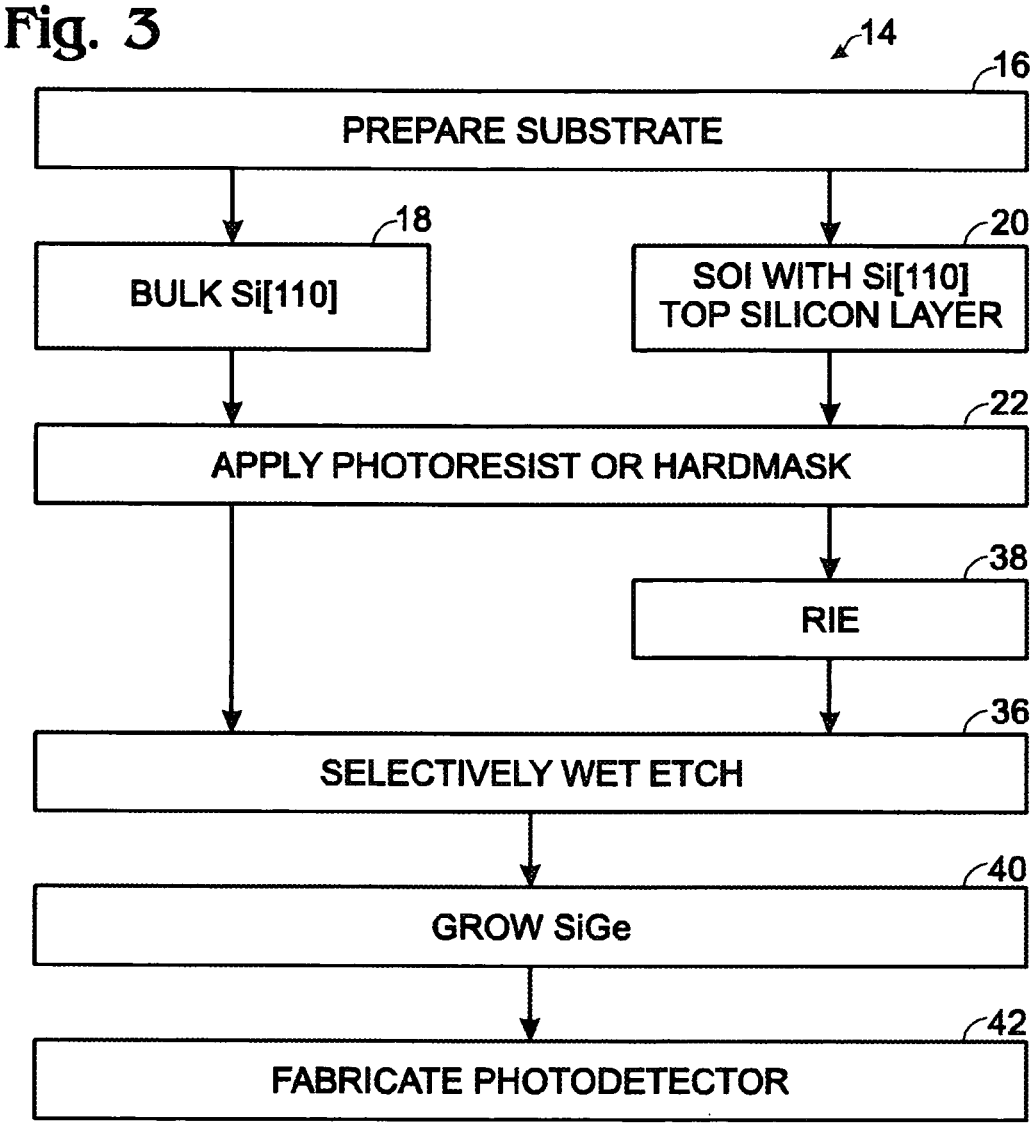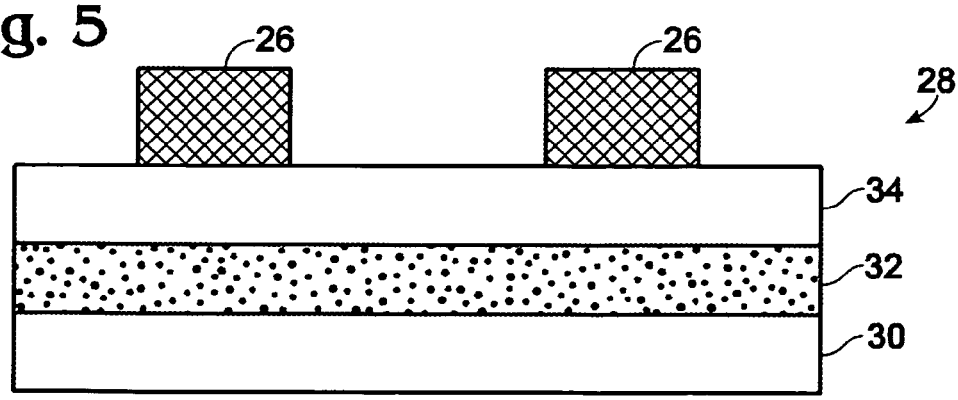

US 7,297,564 B1

FABRICATION OF VERTICAL SIDEWALLS ON (110) SILICON SUBSTRATES FOR USE IN SI/SIGE PHOTODETECTORS

FIELD OF THE INVENTION

This invention relates to photodetectors, and particularly to near-infrared photodetectors integrated on silicon substrates.

BACKGROUND OF THE INVENTION

Photo detecting in the near infrared regime, i.e., having a wavelength of between 0.7 µm to 2 µm, has many applications, such as in fiber-optic communication, security applications, machine vision and night vision imaging. Although III-V compound semiconductors provide superior optical performance over their silicon-based counterparts, the compatibility of silicon based materials with current silicon-IC technology provides the possibility of making cheap, small and highly integrated optical systems. The following references provide additional background for the invention: Maiti et al., *Strained Silicon Heterostructures: Materials and Devices*, Chapter 10: Si/SiGe Optoelectronics, The Institution of Electrical Engineer, 2001; Murtaza et al., *Room Temperature Electroabsorption in $Ge_xSi_{1-x}$ PIN Photodiode*, IEEE Trans. on Electron Devices, 2297-2300, Vol. 41, No. 12, 1994; Tashiro et al., *A Selective Epitaxial SiGe/Si Planar Photodetector for Si-Based OEICs*, IEEE Trans. on Electron Devices, 545-550, Vol. 44, No. 4, 1997; Vonsovici et al., *Room Temperature Photocurrent Spectroscopy of SiGe/Si p-i-n Photodiodes Grown by Selective Epitaxy*, IEEE Trans. on Electron Devices, 538-542, Vol. 45, No. 2, 1998; and Jones et al., *Fabrication and Modeling of Gigahertz Photodetectors in Heteroepitaxial Ge-on-Si using Graded Buffer Layer Deposited by Low Energy Plasma Enhanced CVD*, IEDM, 2002.

Silicon photodiodes are widely used as photodetectors for visible light due to their low dark current and compatibility with silicon IC technologies. The use of $Si_{1-x}Ge_x$ (SiGe) alloys in silicon processing permits photo detection operating in the 0.8 µm to 1.6 µm wavelength regime.

SiGe alloys have larger lattice constants than pure silicon, thus, the epitaxial growth of SiGe on silicon has a critical thickness, above which the film begins to relax by the nucleation of dislocations. The critical thickness of SiGe depends on the germanium concentration and device process temperature. Houghton, *Strain relaxation kinetics in $Si_{1-x}Ge_x/Si$ heterostructures*, J. Appl. Phys. Vol. 780, No. 4, 1991.

A high germanium concentration and high device process temperature result in a smaller critical thickness. In common practice, the SiGe critical thickness is in the range of few hundred angstroms to a maximum of a couple thousand angstroms. Once the SiGe thickness is grown above its critical thickness, lattice defects in SiGe are inevitable. An IR photo detector built on SiGe containing lattice defects will have a high dark current and produce electronic noise.

Quantum efficiency is the number of electron-hole pairs generated per incident photon and is a parameter for photo detector sensitivity. The quantum efficiency is defined as:

$$\eta = (I_p/q)/(P_{opt}/h\nu) \qquad (1)$$

where Ip is the photo-generated current by the absorption of incident optical power $P_{opt}$ at the light frequency v, where q is the electron charge, and h is Planck's constant.

One of the key factors that determines the quantum efficiency is the absorption coefficient, α. Silicon has a cutoff wavelength of about 1.1 µm and is transparent to wavelengths beyond ~1.2 µm. The SiGe absorption edge shifts to the red with increasing germanium mole fraction and is shown in FIG. 1. The absorption coefficient of SiGe alloy is small and the critical thickness limits the absorbing layer thickness. The major aim of SiGe based photo detectors is to achieve high quantum efficiency and integration with existing silicon electronics.

One way to increase the optical path and improve the quantum efficiency is to illuminate the edge of the photo detector with light so that the light propagates parallel to the heterojunction (SiGe/Si) interfaces. However, this does not allow the device to be used in image detection. Growing strained, defect-free SiGe films or SiGe/Si multilayer structures on the sidewalls of etched silicon structures has been disclosed by Lee et al., *Surface-Normal Optical Path Structure for Infrared Photodetection*, U.S. Patent Publication No. 2005/0136637-A1, published Jun. 23, 2005; and Tweet et al., *Vertical Optical Path Structure for Infrared Photodetection*, U.S. Patent Publication No. 2005/0153474-A1, published Jul. 14, 2005. In devices incorporating the technology described in the two preceding references, illumination of the device is normal to the silicon substrate, however, light travels parallel to the heterojunction interface to increase the optical path length. Therefore, two-dimensional IR image detection may be achieved within thin SiGe or SiGe/Si film thicknesses.

Fabrication of high quality, defect-free strained SiGe films requires SiGe growth on a defect-free silicon surface. However, referring to FIG. 2, reactive ion-etching (RIE) of silicon usually results in a sloped sidewall, shown generally at 10, and in poor crystal quality near the sidewall surface, as shown generally at 12, where a damaged area of silicon is formed near an RIE-etched sidewall. Also, the surface is often rather rough. Ideally, these defects may be cured by use of a selective etch, which etches the desired sidewall crystal plane more slowly than it does other planes. For various kinds of silicon device fabrication, silicon substrates having a (001) plane parallel to the wafer surface are most commonly used. Etching of a trench in this substrate renders the sidewalls parallel to the (110) planes or (100) planes, depending on the azimuthal rotation of the wafer. Making these sidewalls more vertical requires a selective etch, which etches the (110) or (100) planes, respectively, more slowly than other planes. However, such an etch process is not known in the prior art. Instead, there are well-known selective etches which etch the (111) plane much more slowly than other planes.

One way around this problem is to change the substrate to one with the silicon (110) plane parallel to the wafer surface, Liu et al., *Multi-Fin Double-Gate MOSFET Fabricated by using (110)-Oriented SOI wafers and Orientation-Dependent Etching*, Electrochemical Society Proceedings, vol. 2003-06, 566 (2003). Then, the sidewall plane may be silicon (111) or any other related, equivalent orthogonal plane. Liu et al. used a 2.38% tetramethylammonium hydroxide (TMAH) solution to etch vertical sidewalls and form a silicon fin structure with rectangular cross-section on silicon-on-insulator wafers. These were then used to fabricate silicon-FINFET (FIN Field-Effect Transistor) devices. Liu et al. report that TMAH etches (110) planes 23-25 times faster than silicon (111) planes. In addition, the use of a selective wet etch instead of RIE results in undamaged crystalline silicon at the sidewall surfaces.

SUMMARY OF THE INVENTION

A method of fabricating vertical sidewalls on silicon (110) substrates for use in Si/SiGe photodetectors includes preparing a silicon (110) layer wherein the silicon (110) plane is parallel to an underlying silicon wafer surface. Masking the silicon (110) layer with mask sidewalls parallel to a silicon (111) layer plane and etching the silicon (110) layer to remove an un-masked portion thereof, leaving a patterned silicon (110) layer. Finally, the mask is removed, and SiGe-containing layers are grown on the patterned silicon (110) layer. The photodetector is then completed.

It is an object of the invention to improve the quantum efficiency of photodetectors, e.g., near-IR photodetectors, integrated on silicon substrates.

Another object of the invention is to provide a method for using silicon (110) substrates and selective chemical etching to fabricate vertical sidewalls on which to grow strained SiGe and/or SiGe/Si multilayer structures for use in photodetectors, such as near-IR photodetectors.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 3 is a block diagram of the method of the invention.

FIG. 5 depicts use of a SOI (110) substrate.

DETAILED DESCRIPTION OF THE PREFERRED EMBODIMENTS

Figure 1:
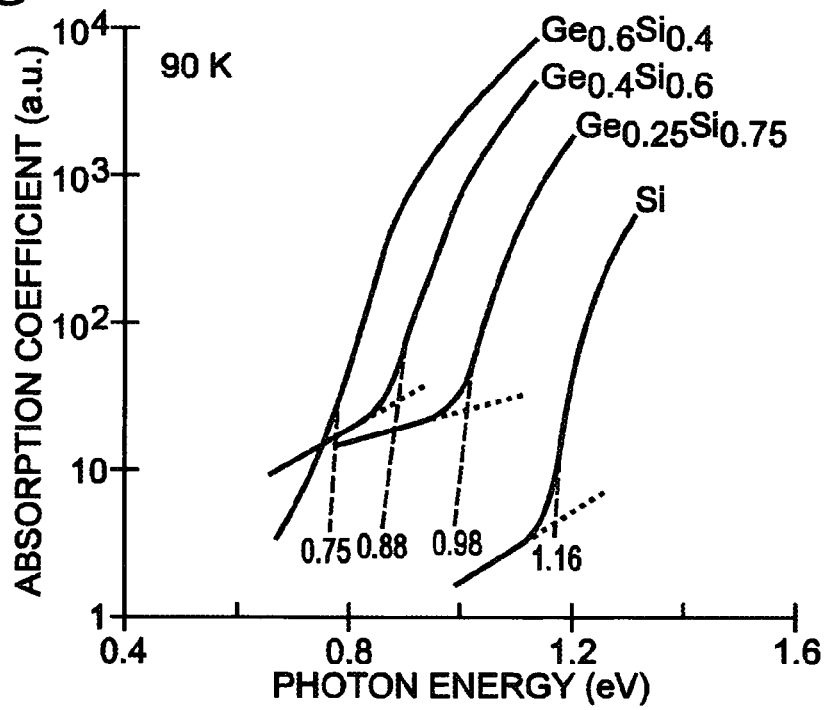
FIG. 1 represents normalized photocurrent spectra for various SiGe sample.
Figure 2:
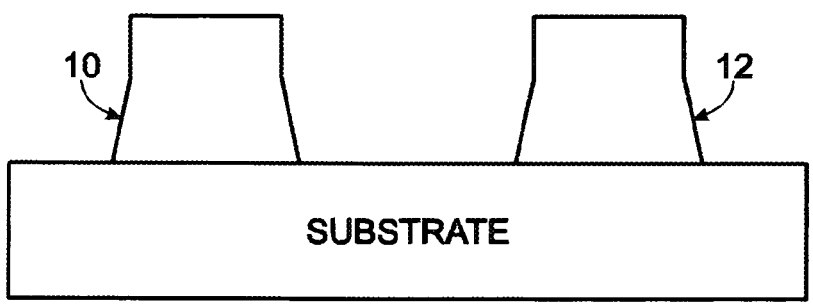
FIG. 2 is a schematic profile of RIE-etched silicon structures.

The objective of this invention is to improve the quantum efficiency of photodetectors, e.g., near-IR photodetectors, integrated on silicon substrates. This is done by providing silicon structures with nearly vertical sidewalls and low crystalline defects to enable the growth of low-defect strained, epitaxial SiGe and/or SiGe/Si multilayers on the sidewalls. By so doing, the optical path length for absorption of light is be determined by the height of the sidewalls, and not by the SiGe film thickness. In this way the quantum efficiency of the photodetector is improved.

As previously noted, the use of reactive ion-etching (RIE) to etch silicon structures results in rough, damaged sidewalls with unacceptably large slopes. The readily available selective etch processes do not improve this situation on silicon (001) substrates. The present invention uses silicon (110) substrates and selective chemical etching to fabricate vertical sidewalls on which to grow strained SiGe and/or SiGe/Si multilayer structures for use in photodetectors, such as near-IR photodetectors.

Referring now to FIG. 3, the method of the invention is depicted generally at 14, includes preparation of a substrate, usually in the form of a silicon wafer, 16. The starting substrate has a silicon (110) plane parallel to the wafer surface. The substrate may be a bulk silicon (110) wafer 18, or it may be a silicon-on-insulator (SOI) wafer in which the top silicon has the (110) plane parallel to the wafer surface, referred to herein as a SOI(110) wafer 20. In the latter case, the top silicon needs to be sufficiently thick, e.g., 0.1 micron to 1.0 micron, or more, so as to result in a longer optical path length of the deposited SiGe film than can be achieved by the usual deposition on a planar substrate, i.e., the critical thickness. Note that it is only necessary for the top silicon to have the (110) plane parallel to the wafer surface. If a wafer-bonding technique, such as SmartCut® or Eltran®, is used, the silicon substrate beneath the buried-oxide (BOX) may have the usual (100) orientation. This procedure is likely less expensive than using a substrate of silicon (110).

Figure 4:
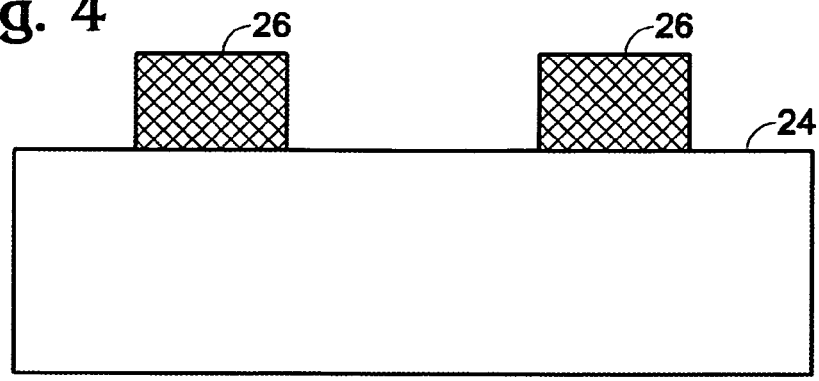
FIG. 4 depicts use of a bulk silicon (110) substrate.

In preparation for forming the vertical silicon surfaces, a photoresist, or hardmask, such as CVD deposited $SiO_2$, pattern is fabricated, by any state-of-the art method, 22. It is important that the sidewalls of the photoresist or hardmask are parallel to the silicon (111) or equivalent plane, as shown in FIG. 4, wherein a silicon (110) substrate 24 has a mask 26 thereon. The mask sidewalls are parallel to the silicon (111) plane. FIG. 5 depicts a SOI (110) wafer 28, having a silicon substrate 30, a BOX layer 32 thereon, and a top silicon (110) layer 34. Mask elements 26 are formed on top silicon layer 24, again so that the mask sidewalls are parallel to the silicon (111). Vertical silicon surfaces with silicon (111) sidewalls can then be fabricated by one of two methods:

Wet Etch Only

Figure 6:
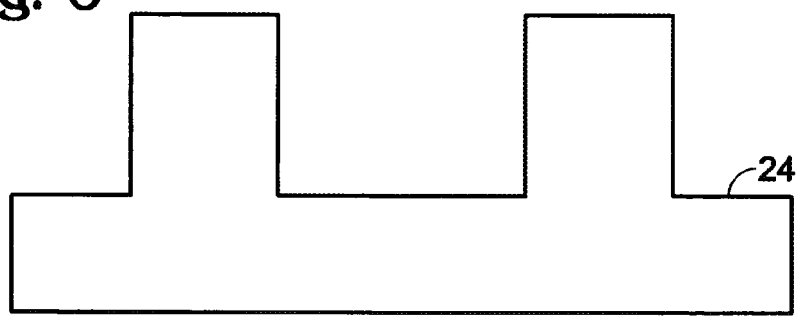
FIG. 6 depicts bulk silicon (110) substrate following direct use of selective wet etch.
Figure 7:
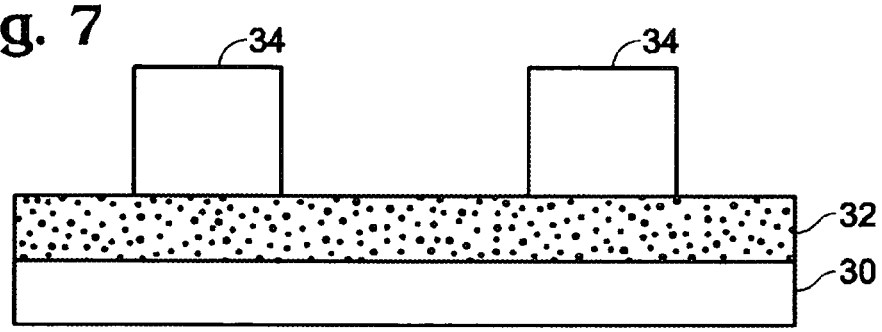
FIG. 7 depicts SOI (110) substrate following selective wet etch.

A selective chemistry, such as a 2.38% tetramethylammonium hydroxide (TMAH) solution, is used to etch the (110) planes while barely etching the (111) planes, 36, to remove a portion of the un-masked silicon (110) layer. The mask is then removed. This solution etches silicon (110) about 23-25 times faster than it does silicon (111), which results in a sidewall slope of ~4% from vertical, or a 86° sidewall, as shown in FIGS. 6 and 7. The height of the sidewall is determined by the etch time for the bulk silicon (110) wafer, FIG. 6. In the case of SOI (110), FIG. 7, the etch stops at the BOX, so the sidewall height is determined by the thickness of the top silicon. The advantage of this method is that there is little or no damage to the crystal lattice along the sidewall surface. The disadvantage is that the sidewall angle is directly limited by etch selectivity, i.e., the higher the selectivity, the more vertical the sidewall.

Reactive Ion Etch (RIE) Followed by Selective Wet Etch

Figure 8:
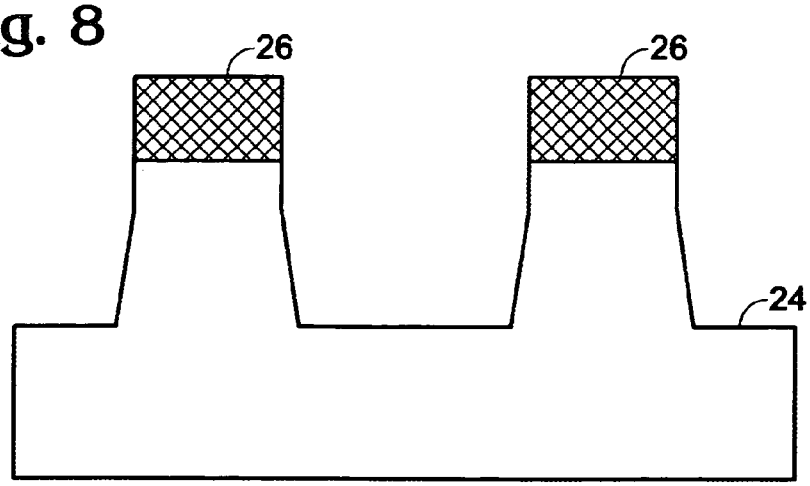
FIG. 8 depicts bulk silicon (110) substrate following anisotropic RIE etch.
Figure 9:
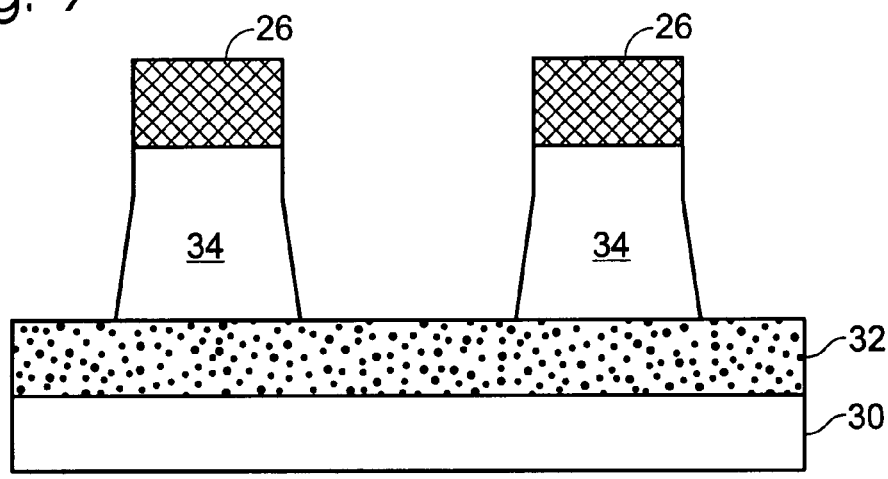
FIG. 9 depicts SOI (110) substrate following anisotropic RIE etch.
Figure 10:
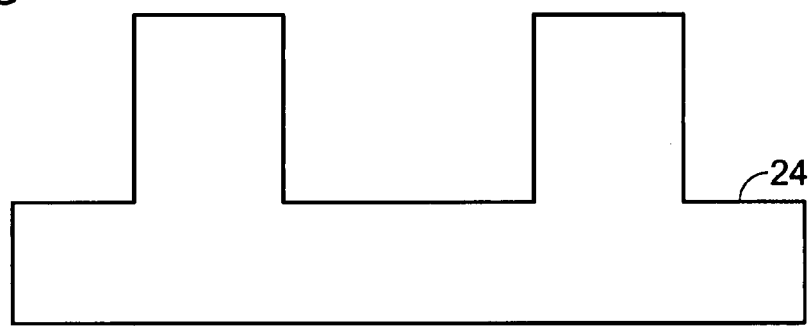
FIG. 10 depicts bulk silicon (110) substrate following anisotropic RIE etch and selective wet etch.
Figure 11:
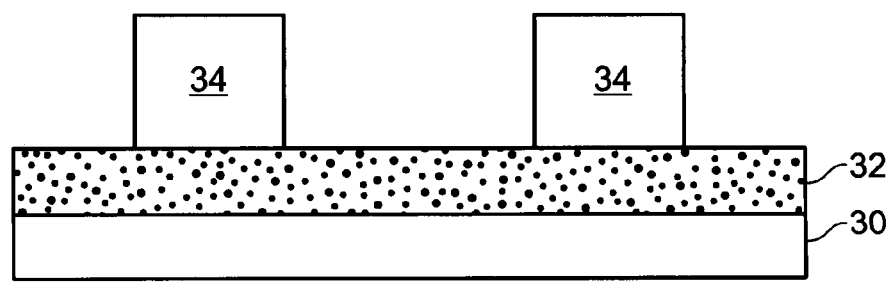
FIG. 11 depicts SOI (110) substrate following anisotropic RIE etch and selective wet etch.

RIE may be used to anisotropically etch 38 most of the un-masked silicon (110) layer, FIGS. 8 and 9. Then, with the photoresist or hardmask pattern still intact, a short selective wet etch may be used to etch (110) while barely etching (111), as shown in FIGS. 10 and 11. The mask is then removed. The advantage of this method is that a more vertical sidewall results, i.e., closer to 90°. The disadvantage is that crystal damage near the sidewall needs to be removed. This may be done by several techniques, such as growing a thin thermal oxide and removing it with an HF etch, and/or annealing the etched silicon substrate to recrystallize the damaged region.

In either case, the height of the resulting sidewall may be adjusted to meet the needs of the application. In general, sidewalls with heights of 0.1 micron to 1.0 micron, or more, can be fabricated. Strained SiGe films or strained SiGe/Si multilayer structures having a germanium content from 5% to 100% can then be epitaxially grown, 40, on these patterned, remaining silicon (110) structures and used in photodetector fabrication, 42, as described in by Lee et al., supra, for non-selective epitaxy, and by Tweet et al., supra, for selective epitaxy, i.e., epitaxial growth on silicon but not on oxide or nitride.

Thus, a method for fabrication of vertical sidewalls on (110) silicon substrates for use in Si/SiGe photodetectors has been disclosed. It will be appreciated that further variations and modifications thereof may be made within the scope of the invention as defined in the appended claims.

We claim:

1. A method of fabricating vertical sidewalls on silicon (110) substrates for use in Si/SiGe photodetectors, comprising:
    preparing a silicon (110) layer wherein the silicon (110) plane is parallel to an underlying silicon wafer surface;
    masking the silicon (110) layer with mask sidewalls parallel to a silicon (111) layer plane;
    etching the silicon (110) layer to remove an un-masked portion thereof, leaving a patterned silicon (110) layer;
    removing the mask;
    growing SiGe-containing layers on the patterned silicon (110) layer; and
    fabricating a photodetector.

2. The method of claim 1 wherein said preparing a silicon (110) layer includes preparing a bulk silicon (110) substrate.

3. The method of claim 1 wherein said preparing a silicon (110) layer includes preparing a SOI wafer having a silicon (110) top silicon layer thereon.

4. The method of claim 1 wherein said masking the silicon (110) layer includes masking and patterning the silicon (110) layer with a masking taken from the group of maskings consisting of photoresist and hardmasks.

5. The method of claim 1 wherein said etching the silicon (110) layer includes etching by a selective wet etch process.

6. The method of claim 1 wherein said etching the silicon (110) layer includes etching by a RIE process and then further etching the silicon (110) layer by a selective wet etch process which etches silicon (110) planes faster than silicon (111) planes, leaving a patterned silicon (110) surface having silicon (111) sidewalls.

7. A method of fabricating vertical sidewalls on silicon (110) substrates for use in Si/SiGe photodetectors, comprising:
    preparing a silicon (110) layer wherein the silicon (110) plane is parallel to an underlying silicon wafer surface, wherein said preparing a silicon (110) layer includes preparing a bulk silicon (110) substrate or preparing a SOI wafer having a silicon (110) top silicon layer thereon;
    masking the silicon (110) layer with mask sidewalls parallel to a silicon (111) layer plane;
    etching the silicon (110) layer to remove an un-masked portion thereof, leaving a patterned silicon (110) layer;
    removing the mask;
    growing SiGe-containing layers on the patterned silicon (110) layer; and
    fabricating a photodetector.

8. The method of claim 7 wherein said masking the silicon (110) layer includes masking and patterning the silicon (110) layer with a masking taken from the group of maskings consisting of photoresist and hardmasks.

9. The method of claim 7 wherein said etching the silicon (110) layer includes etching by a selective wet etch process.

10. The method of claim 7 wherein said etching the silicon (110) layer includes etching by a RIE process and then further etching the silicon (110) layer by a selective wet etch process which etches silicon (110) planes faster than silicon (111) planes, leaving a patterned silicon (110) surface having vertical silicon (111) sidewalls.

11. A method of fabricating vertical sidewalls on silicon (110) substrates for use in Si/SiGe photodetectors, comprising:
    preparing a silicon (110) layer wherein the silicon (110) plane is parallel to an underlying silicon wafer surface;
    masking the silicon (110) layer with mask sidewalls parallel to a silicon (111) layer plane;
    etching the silicon (110) layer to remove an un-masked portion thereof, leaving a patterned silicon (110) layer, wherein said etching the silicon (110) layer includes etching by a RIE process and then further etching the silicon (110) layer by a selective wet etch process which etches silicon (110) planes faster than silicon (111) planes, leaving a patterned silicon (110) surface having vertical silicon (111) sidewalls;
    removing the mask;
    growing SiGe-containing layers on the patterned silicon (110) layer; and
    fabricating a photodetector.

12. The method of claim 11 wherein said preparing a silicon (110) layer includes preparing a bulk silicon (110) substrate.

13. The method of claim 11 wherein said preparing a silicon (110) layer includes preparing a SOI wafer having a silicon (110) top silicon layer thereon.

14. The method of claim 11 wherein said masking the silicon (110) layer includes masking and patterning the silicon (110) layer with a masking taken from the group of maskings consisting of photoresist and hardmasks.

15. The method of claim 11 wherein said etching the silicon (110) layer includes etching by a selective wet etch process.

* * * * *